(12) United States Patent
Mao

(10) Patent No.: US 10,470,334 B1
(45) Date of Patent: Nov. 5, 2019

(54) ELECTRONIC DEVICE AND TRAY

(71) Applicant: Wistron Corporation, New Taipei (TW)

(72) Inventor: Zhong-Hui Mao, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/296,139

(22) Filed: Mar. 7, 2019

(30) Foreign Application Priority Data

Jan. 8, 2019 (CN) .......................... 2019 1 0015840

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | | |
|---|---|---|---|---|
| 5,481,431 A * | 1/1996 | Siahpolo | ................. | G06F 1/184 361/679.31 |
| 5,641,296 A * | 6/1997 | Larabell | ................. | G06F 1/184 439/157 |
| 9,122,458 B2 * | 9/2015 | Yu | .......................... | G06F 1/185 |
| 9,826,658 B1 * | 11/2017 | Mao | ..................... | H05K 7/1487 |
| 10,251,300 B1 * | 4/2019 | Mao | ..................... | H05K 7/1489 |
| 2004/0017650 A1 * | 1/2004 | Liu | ......................... | G06F 1/184 361/679.33 |
| 2009/0225527 A1 * | 9/2009 | Olesiewicz | ........ | H05K 7/20727 361/802 |
| 2009/0273901 A1 * | 11/2009 | Jaramillo | ............. | H05K 7/1492 361/679.58 |
| 2016/0073554 A1 * | 3/2016 | Marcade | ................ | H05K 5/023 211/26 |

* cited by examiner

*Primary Examiner* — Xanthia C Cunningham
(74) *Attorney, Agent, or Firm* — Winston Hsu

(57) ABSTRACT

An electronic device includes a casing and a tray. The casing includes an engaging portion. The tray is disposed in the casing. The tray includes a tray body, a handle, a sliding member, an elastic member and a lock member. The handle includes a first driving portion. The sliding member includes a first driving groove and a second driving groove. The lock member includes a second driving portion, a through hole and an engaging recess. The engaging portion engages with the engaging recess. When the handle moves along a first direction, the first driving portion presses the first driving groove, such that the sliding member moves along a second direction. When the sliding member moves along the second direction, the second driving groove presses the second driving portion, such that the lock member moves along a third direction and then the engaging portion disengages from the engaging recess.

15 Claims, 12 Drawing Sheets

ELECTRONIC DEVICE AND TRAY

BACKGROUND OF THE DISCLOSURE

1. Field of the Disclosure

The disclosure relates to an electronic device and a tray and, more particularly, to a tray capable of being assembled or disassembled conveniently and an electronic device equipped with the tray.

2. Description of the Prior Art

A server is used to serve various computers or portable electronic devices in network system. To satisfy various requirements of functions, some servers are equipped with an electronic module with a specific weight. For example, a server applied to test a self-driving vehicle is equipped with a self-driving simulator with a weight about 7 kg. In general, a casing of the server may be further equipped with various electronic components, such that an operation space within the casing is limited. Therefore, how to allow a user to assemble or disassemble the electronic module within a limited space conveniently and rapidly has become a significant design issue.

SUMMARY OF THE DISCLOSURE

The disclosure provides a tray capable of being assembled or disassembled conveniently and an electronic device equipped with the tray, so as to solve the aforesaid problems.

According to an embodiment of the disclosure, an electronic device includes a casing and a tray. The casing includes an engaging portion. The tray is disposed in the casing. The tray includes a tray body, a handle, a sliding member, an elastic member and a lock member. The tray body includes a side plate and a bottom plate. The handle is movably connected to the side plate. The handle includes a first driving portion. The sliding member is movably connected to the side plate. The sliding member includes a first driving groove and a second driving groove. The first driving portion is disposed in the first driving groove. Opposite ends of the elastic member are respectively connected to the side plate and the sliding member. The lock member is movably connected to the bottom plate. The lock member includes a second driving portion, a through hole and an engaging recess. The second driving portion is disposed in the second driving groove. The through hole is connected to the engaging recess. The engaging portion engages with the engaging recess. When the handle moves along a first direction, the first driving portion presses a side wall of the first driving groove, such that the sliding member moves along a second direction and deforms the elastic member. When the sliding member moves along the second direction, a side wall of the second driving groove presses the second driving portion, such that the lock member moves along a third direction. After the lock member moves along the third direction, the engaging portion disengages from the engaging recess and is aligned with the through hole. The second direction is perpendicular to the first direction, and the third direction is perpendicular to the first direction and the second direction.

According to an embodiment of the disclosure, a tray includes a tray body, a handle, a sliding member, an elastic member and a lock member. The tray body includes a side plate and a bottom plate. The handle is movably connected to the side plate. The handle includes a first driving portion. The sliding member is movably connected to the side plate. The sliding member includes a first driving groove and a second driving groove. The first driving portion is disposed in the first driving groove. Opposite ends of the elastic member are respectively connected to the side plate and the sliding member. The lock member is movably connected to the bottom plate. The lock member includes a second driving portion, a through hole and an engaging recess. The second driving portion is disposed in the second driving groove. The through hole is connected to the engaging recess. When the handle moves along a first direction, the first driving portion presses a side wall of the first driving groove, such that the sliding member moves along a second direction and deforms the elastic member. When the sliding member moves along the second direction, a side wall of the second driving groove presses the second driving portion, such that the lock member moves along a third direction. The second direction is perpendicular to the first direction, and the third direction is perpendicular to the first direction and the second direction.

According to an embodiment of the disclosure, an electronic device includes a casing and a tray. The casing includes an engaging portion. The tray is disposed in the casing. The tray includes a tray body, a handle, a sliding member and an elastic member. The tray body includes a side plate. The handle is movably connected to the side plate. The handle includes a driving portion. The sliding member is movably connected to the side plate. The sliding member includes a driving groove, a through hole and an engaging recess. The driving portion is disposed in the driving groove. The through hole is connected to the engaging recess. The engaging portion engages with the engaging recess. Opposite ends of the elastic member are respectively connected to the side plate and the sliding member. When the handle moves along a first direction, the driving portion presses a side wall of the driving groove, such that the sliding member moves along a second direction and deforms the elastic member. After the sliding member moves along the second direction, the engaging portion disengages from the engaging recess and is aligned with the through hole. The second direction is perpendicular to the first direction.

As mentioned in the above, the disclosure may dispose an electronic module (e.g. self-driving simulator) on the tray. When the tray is locked on the casing, a user just needs to lift the handle to release the tray from the casing, so as to lift and remove the tray and the electronic module from the casing. Furthermore, the user may lift the handle and place the tray and the electronic module into the casing. Then, the user just needs to release the handle, such that the tray may be locked on the casing automatically by means of an elastic force generated by the elastic member. Accordingly, the user can utilize the tray of the disclosure to assemble or disassemble the electronic module conveniently and rapidly.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
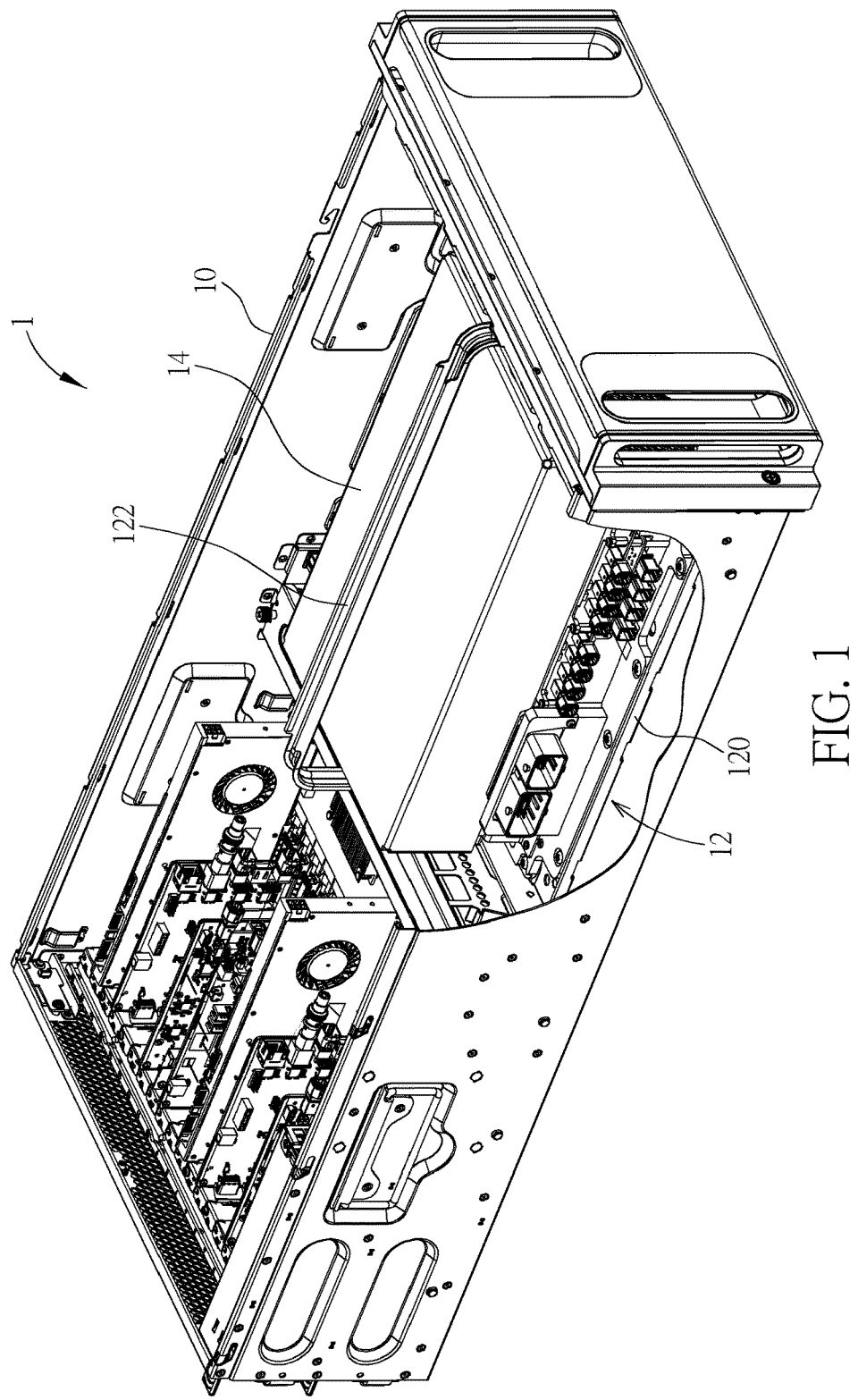
FIG. 1 is a perspective view illustrating an electronic device according to an embodiment of the disclosure.
Figure 2:
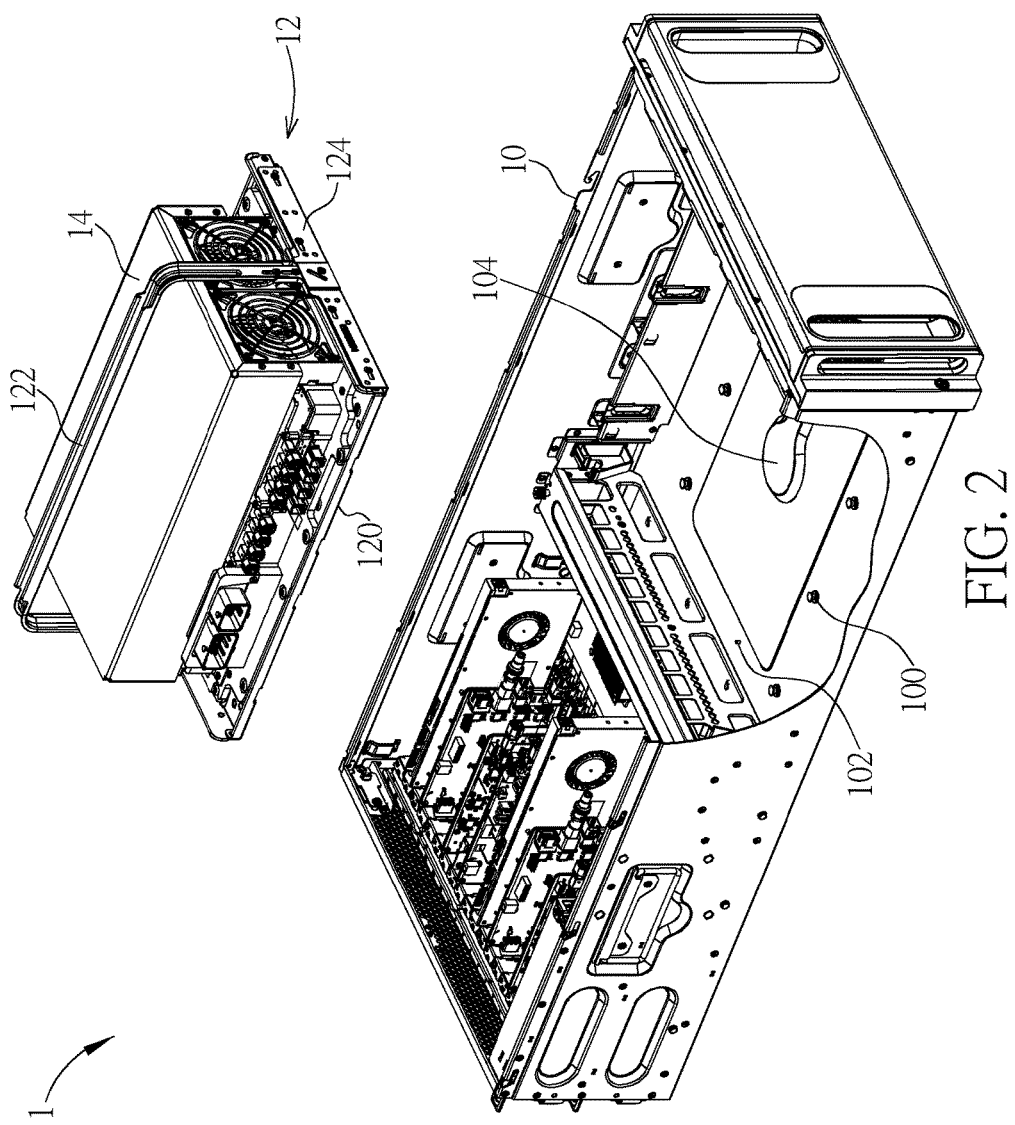
FIG. 2 is a perspective view illustrating the tray and the electronic module shown in FIG. 1 being disassembled from the casing.

As shown in FIGS. 1 and 2, the electronic device 1 includes a casing 10, a tray 12 and an electronic module 14, wherein the electronic module 14 is disposed on the tray 12 and the tray 12 is disposed in the casing 10. In this embodiment, the electronic device 1 may be, but not limited to, a server applied to test a self-driving vehicle and the electronic module 14 may be, but not limited to, a self-driving simulator. It should be noted that the casing 10 shown in FIGS. 1 and 2 is only a part of a complete casing of the electronic device 1.

Figure 3:
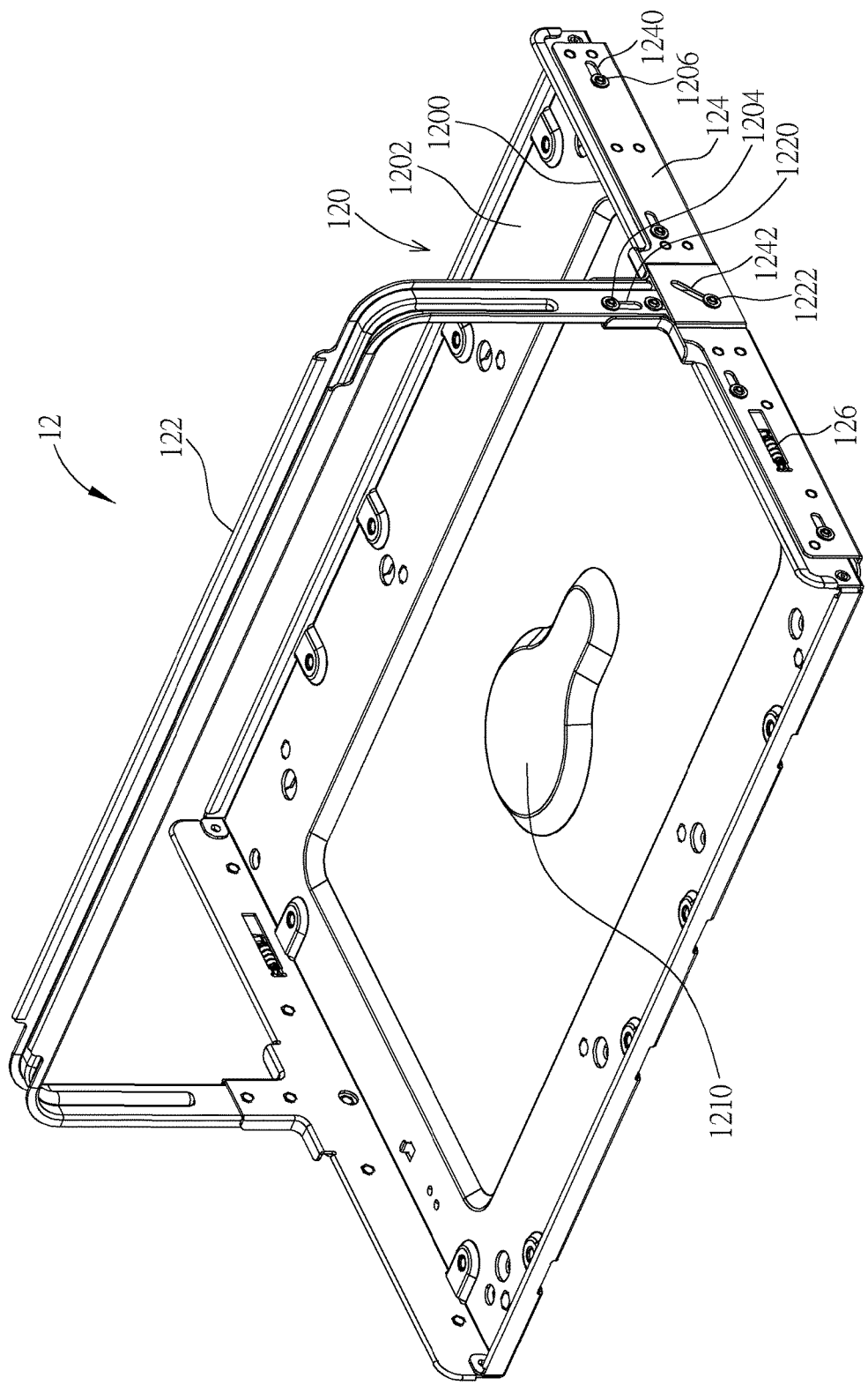
FIG. 3 is a perspective view illustrating the tray shown in FIG. 2.
Figure 4:
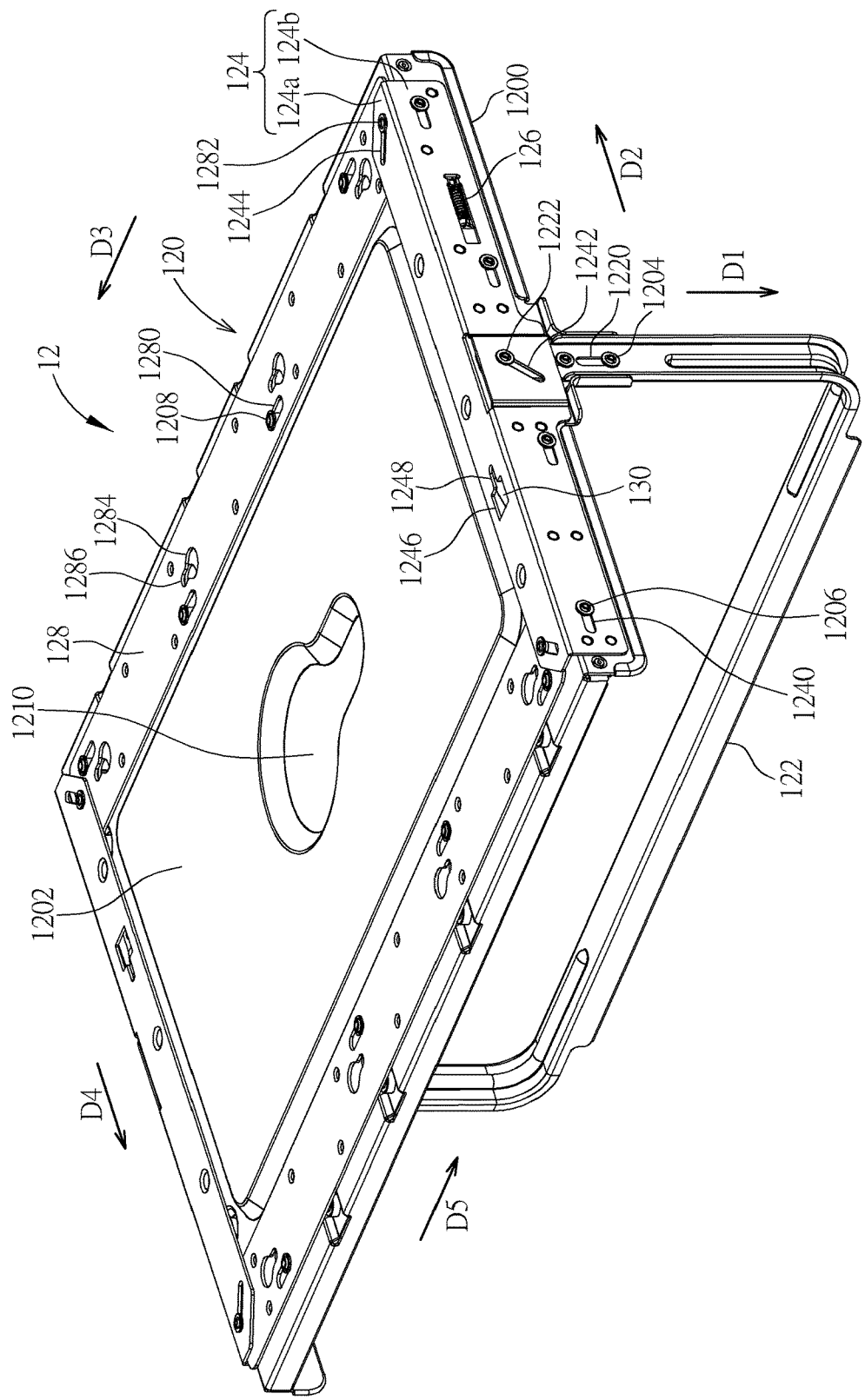
FIG. 4 is a perspective view illustrating the tray shown in FIG. 3 from another viewing angle.
Figure 5:
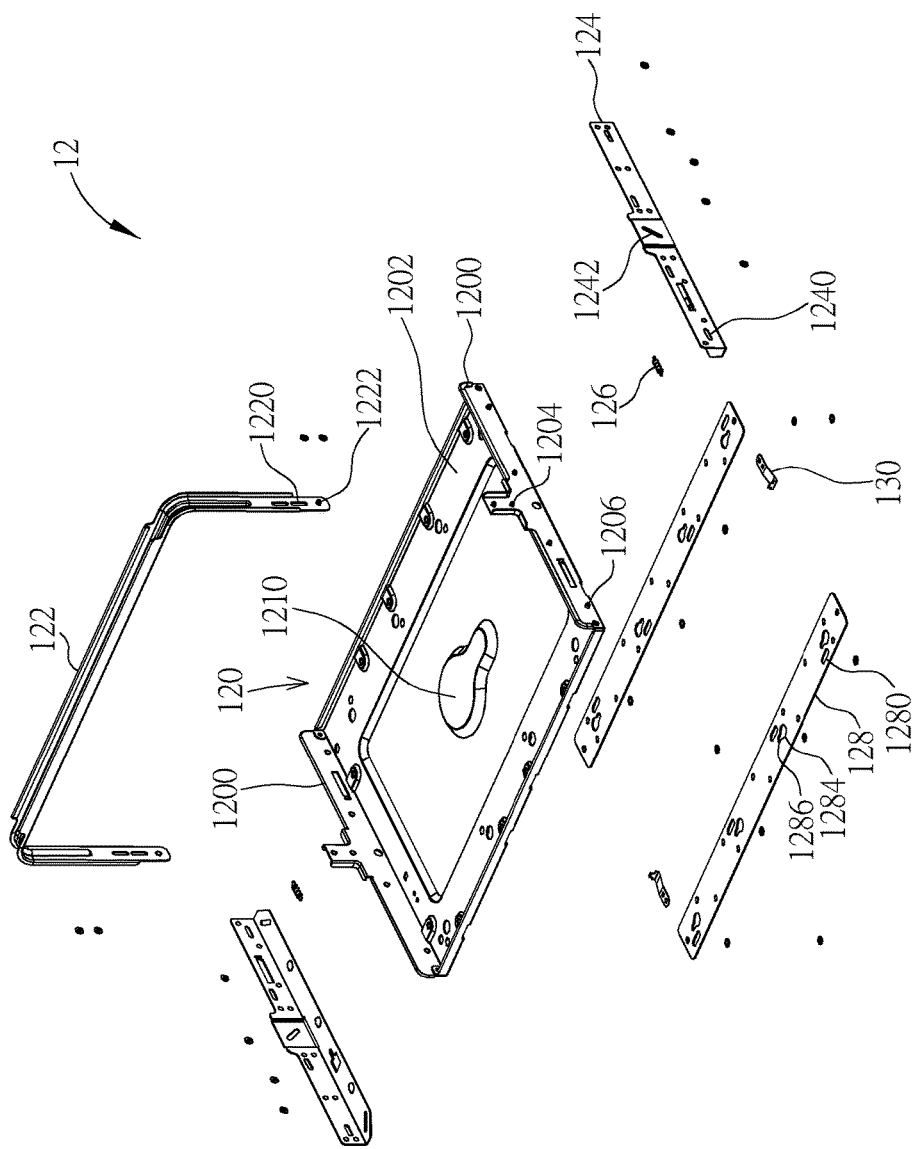
FIG. 5 is an exploded view illustrating the tray shown in FIG. 3.

As shown in FIGS. 3 to 5, the tray 12 includes a tray body 120, a handle 122, a sliding member 124, an elastic member 126 and a lock member 128. The tray body 120 includes a side plate 1200 and a bottom plate 1202. In this embodiment, the tray body 120 includes two side plates 1200 and the two side plates 1200 respectively extend from opposite sides of the bottom plate 1202. Opposite ends of the handle 122 are movably connected to the two side plates 1200. In this embodiment, the sideplate 1200 may include a first connecting portion 1204 and the end of the handle 122 may include a first sliding groove 1220. The first connecting portion 1204 is disposed in the sliding groove 1220, such that the handle 122 is movably connected to the side plate 1200. It should be noted that the number of the first connecting portions 1204 and the first sliding grooves 1220 may be determined according to practical applications, so the disclosure is not limited to the embodiment shown in the figures. Furthermore, the end of the handle 122 includes a first driving portion 1222.

The sliding member 124 is movably connected to the side plate 1200 of the tray body 120. In this embodiment, the side plate 1200 may include a second connecting portion 1206 and the sliding member 124 may include a second sliding groove 1240. The second connecting portion 1206 is disposed in the second sliding groove 1240, such that the sliding member 124 is movably connected to the side plate 1200. It should be noted that the number of the second connecting portions 1206 and the second sliding grooves 1240 may be determined according to practical applications, so the disclosure is not limited to the embodiment shown in the figures. Furthermore, the sliding member 124 includes a first driving groove 1242 and a second driving groove 1244. In this embodiment, the sliding member 124 may include two plate members 124a, 124b connected with each other to form an L-shape (as shown in FIG. 4), wherein the second sliding groove 1240 and the first driving groove 1242 are located on the plate member 124a, and the second driving groove 1244 is located on the plate member 124b. After assembling the tray 12, the plate member 124a of the sliding member 124 corresponds to the side plate 1200 of the tray body 120 and the plate member 124b of the sliding member 124 corresponds to the bottom plate 1202 of the tray body 120. Still further, the first driving portion 1222 of the handle 122 is disposed in the first driving groove 1242 of the sliding member 124. Moreover, opposite ends of the elastic member 126 are connected to the side plate 1200 of the tray body 120 and the sliding member 124.

The lock member 128 is movably connected to the bottom plate 1202 of the tray body 120. In this embodiment, the bottom plate 1202 may include a third connecting portion 1208, and the lock member 128 may include a third sliding member 1280. The third connecting portion 1208 is disposed in the third sliding groove 1280, such that the lock member 128 is movably connected to the bottom plate 1202. It should be noted that the number of the third connecting portions 1208 and the third sliding grooves 1280 may be determined according to practical applications, so the disclosure is not limited to the embodiment shown in the figures. Furthermore, the lock member 128 includes a second driving portion 1282, a through hole 1284 and an engaging recess 1286, wherein the through hole 1284 is connected to the engaging recess 1286. It should be noted that the number of the through holes 1284 and the engaging recesses 1286 may be determined according to practical applications, so the disclosure is not limited to the embodiment shown in the figures. After assembling the tray 12, the second driving portion 1282 of the lock member 128 is disposed in the second driving groove 1244 of the sliding member 124.

Figure 6:
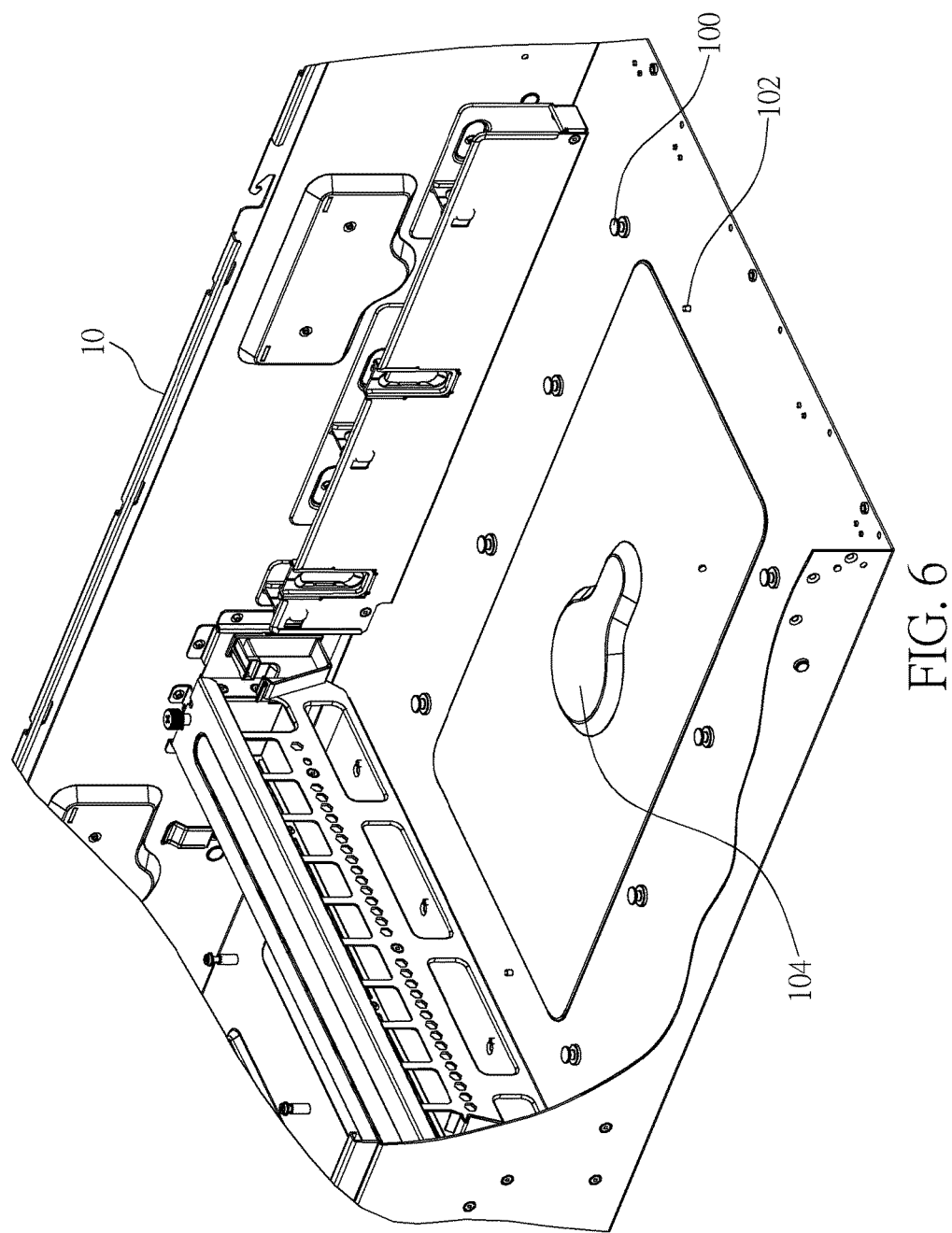
FIG. 6 is a perspective view illustrating the casing shown in FIG. 2.

As shown in FIG. 6, the casing 10 includes an engaging portion 100. It should be noted that the number of the engaging portions 100 may be determined according to practical applications, so the disclosure is not limited to the embodiment shown in the figures. Furthermore, the number and position of the engaging portions 100 of the casing 10 correspond to the number and position of the through holes 1284 and the engaging recesses 1286 of the lock member 128. Moreover, a width of a head portion of the engaging portion 100 is larger than a width of the engaging recess 1286 and smaller than a width of the through hole 1284.

Figure 7:
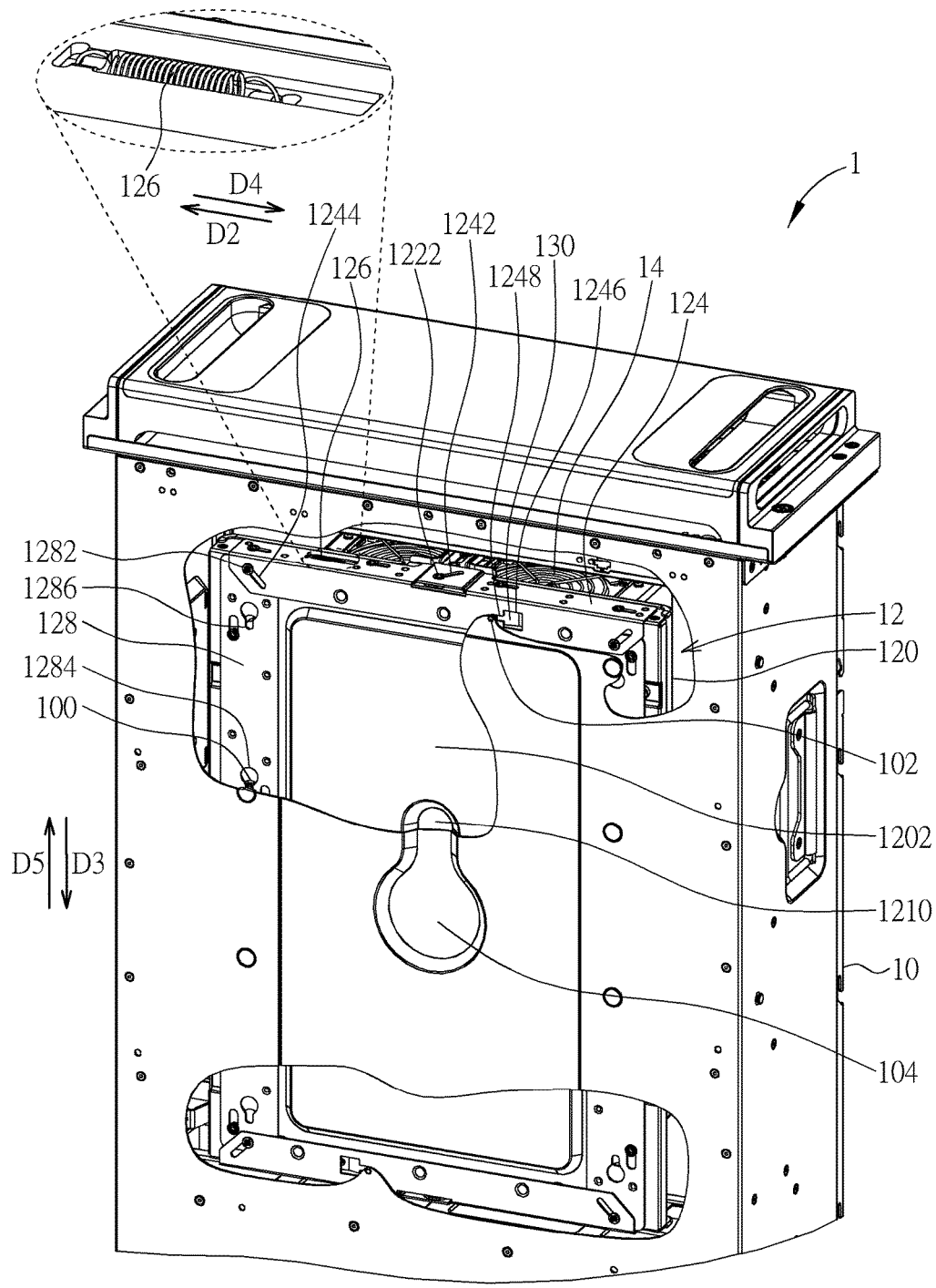
FIG. 7 is a perspective view illustrating the tray locked on the casing.
Figure 8:
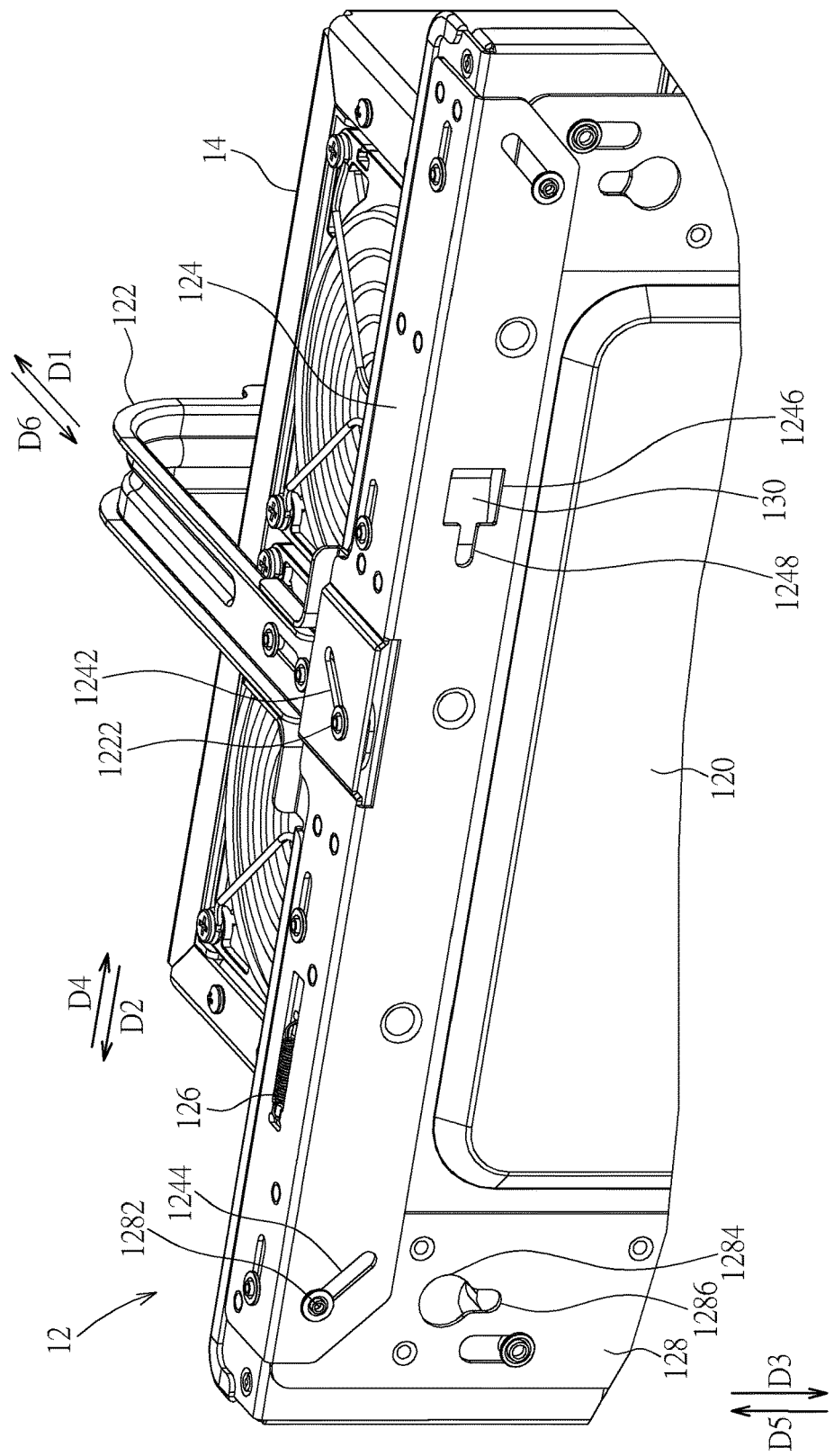
FIG. 8 is a partial perspective view illustrating the tray shown in FIG. 7.

As shown in FIG. 7, when the tray 12 is locked on the casing 10, the engaging portion 100 of the casing 10 engages with the engaging recess 1286 of the lock member 128. At this time, the relative positions of the handle 122, the sliding member 124 and the lock member 128 of the tray 12 are shown in FIG. 8, wherein the elastic member 126 has not deformed yet.

Figure 9:
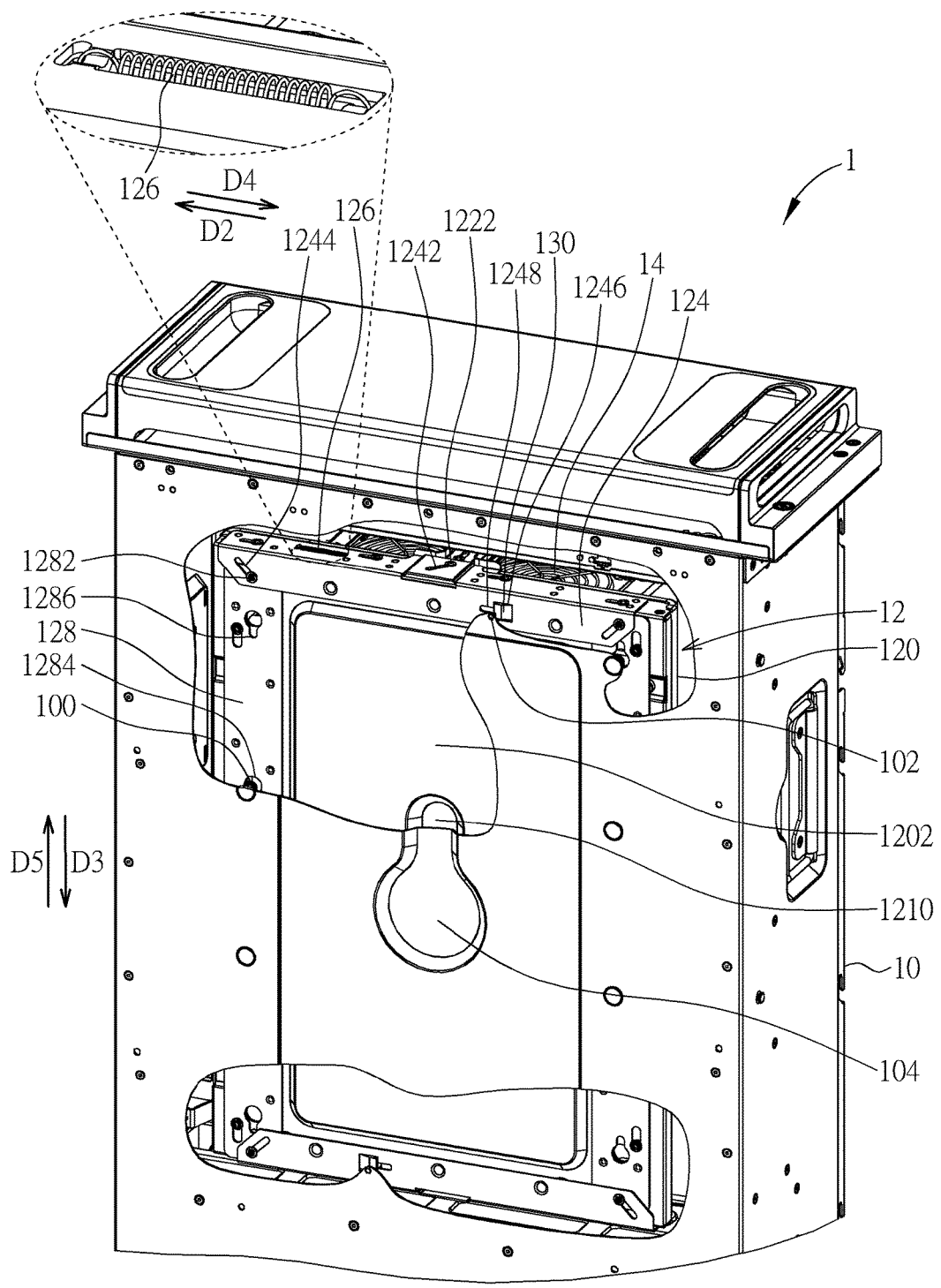
FIG. 9 is a perspective view illustrating the tray released from the casing.
Figure 10:
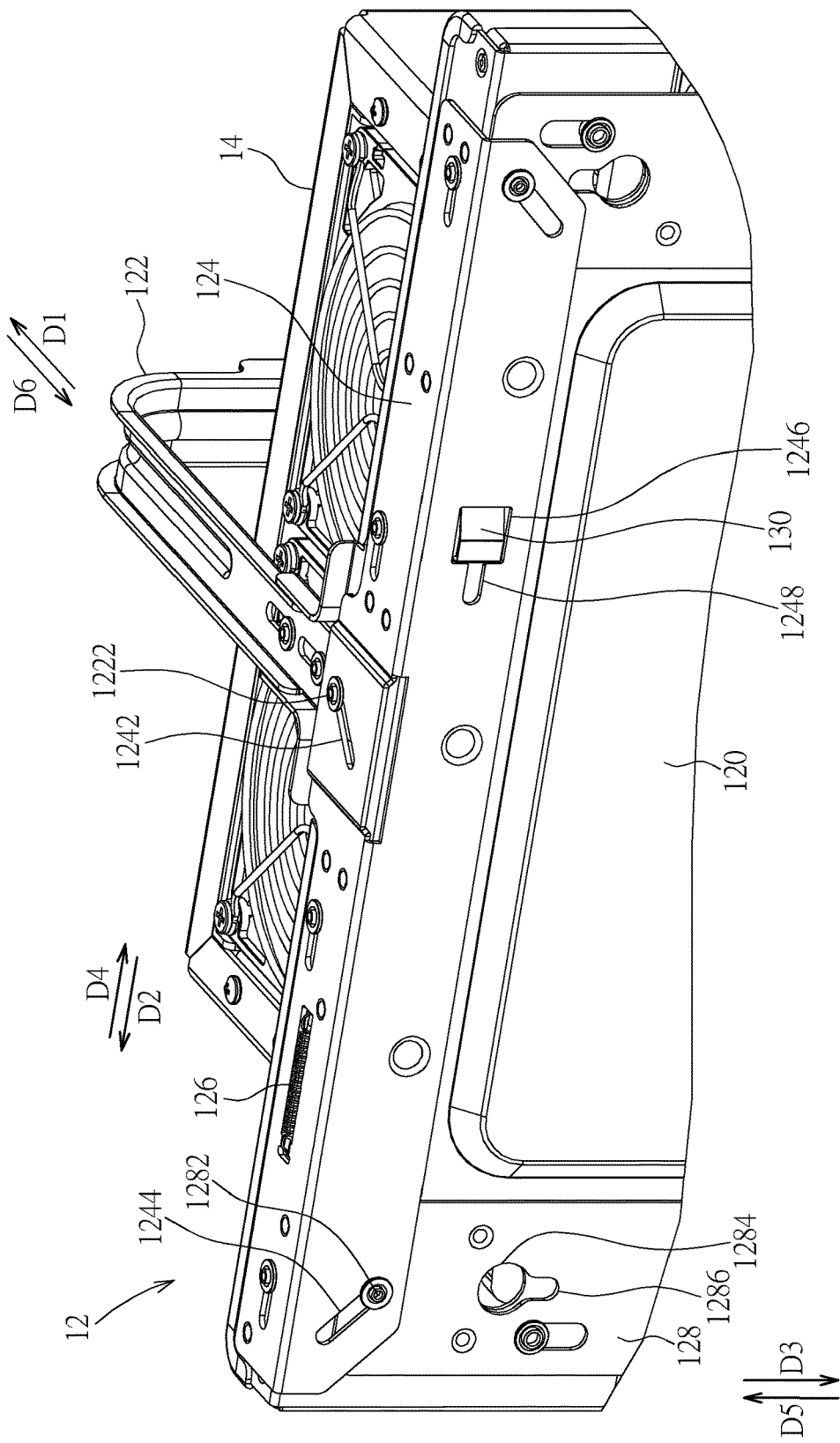
FIG. 10 is a partial perspective view illustrating the tray shown in FIG. 9.

As shown in FIGS. 9 and 10, a user just needs to lift the handle 122 along a first direction D1 to release the tray 12 from the casing 10. When the handle 122 moves along the first direction dl, the first driving portion 1222 of the handle 122 presses a side wall of the first driving groove 1242 of the sliding member 124, such that the sliding member 124 moves along a second direction D2 and deforms the elastic member 126. In this embodiment, after the sliding member 124 moves along the second direction D2, the elastic member 126 is stretched. However, in another embodiment, after the sliding member 124 moves along the second direction D2, the elastic member 126 may also be compressed and it depends on practical applications. When the sliding member 124 moves along the second direction D2, a side wall of the second driving groove 1244 of the sliding member 124 presses the second driving portion 1282 of the lock member 128, such that the lock member 128 moves along a third direction D3. After the lock member 128 moves along the third direction D3, the engaging portion 100 of the casing 10 disengages from the engaging recess 1286 and is aligned with the through hole 1284. At this time, the user can lift and remove the tray 12 and the electronic module 14 from the casing 10. In this embodiment, the second direction D2 is perpendicular to the first direction D1, and the third direction D3 is perpendicular to the first direction D1 and the second direction D2.

In this embodiment, the tray 12 may include an elastic sheet 130 and the elastic sheet 130 is fixed on the bottom plate 1202 of the tray body 120. Furthermore, the sliding member 124 may include a restraining recess 1246. As shown in FIG. 10, after the sliding member 124 moves along the second direction D2, the elastic sheet 130 engages with the restraining recess 1246. Accordingly, after the user lifts and removes the tray 12 and the electronic module 14 from the casing 10, the handle 122, the sliding member 124 and the lock member 128 of the tray 12 may still be kept at the positions shown in FIG. 10 and the elastic member 126 may still be stretched.

In this embodiment, the casing 10 may include a release portion 102. The number and position of the release portions 102 of the casing 10 correspond to the number and position of the elastic sheets 130 of the tray 12. Furthermore, the sliding member 124 may include a pocket recess 1248, wherein the pocket recess 1248 is connected to the restraining recess 1246. Moreover, the casing 10 may include a first positioning portion 104 and the bottom plate 1202 of the tray body 120 may include a second positioning portion 1210, wherein a shape of the first positioning portion 104 corresponds to a shape of the second positioning portion 1210. In this embodiment, the first positioning portion 104 and the second positioning portion 1210 may be, but not limited to, calabash-shaped.

When the user places the tray 12 into the casing 10, shown in FIG. 10, the first positioning portion 104 cooperates with the second positioning portion 1210 to position the tray 12 within the casing 10. In other words, the disclosure may utilize the first positioning portion 104 and the second positioning portion 1210 to prevent the user from placing the tray 12 into the casing 10 along a wrong direction. In another embodiment, the disclosure may also dispose a sliding rail and a sliding groove corresponding to each other on the casing 10 and the tray 12, so as to position the tray 12 in the casing 10.

Furthermore, when the tray 12 is placed into the casing 10 and the release portion 102 is aligned with the elastic sheet 130 (as shown in FIG. 9), the release portion 102 pushes the elastic sheet 130, such that the elastic sheet 130 disengages from the restraining recess 1246. When the elastic sheet 130 disengages from the restraining recess 1246, an elastic force generated by the elastic member 126 drives the sliding member 124 to move along a fourth direction D4, such that the release portion 102 moves from the restraining recess 1246 to the pocket recess 1248 (as shown in FIG. 7). At this time, the elastic sheet 130 abuts against an upper surface of the sliding member 124. In this embodiment, the fourth direction D4 is opposite to the second direction D2.

When the sliding member 124 moves along the fourth direction D4, a side wall of the second driving groove 1244 of the sliding member 124 presses the second driving portion 1282 of the lock member 128, such that the lock member 128 moves along a fifth direction D5. After the lock member 128 moves along the fifth direction D5, the engaging portion 100 of the casing 10 engages with the engaging recess 1286 of the lock member 128, such that the tray 12 is locked on the casing 10. Furthermore, when the sliding member 124 moves along the fourth direction D4, a side wall of the first driving groove 1242 of the sliding member 124 also presses the first driving portion 1222 of the handle 122, such that the handle 122 moves along a sixth direction D6 to return to the position shown in FIG. 8.

Figure 11:
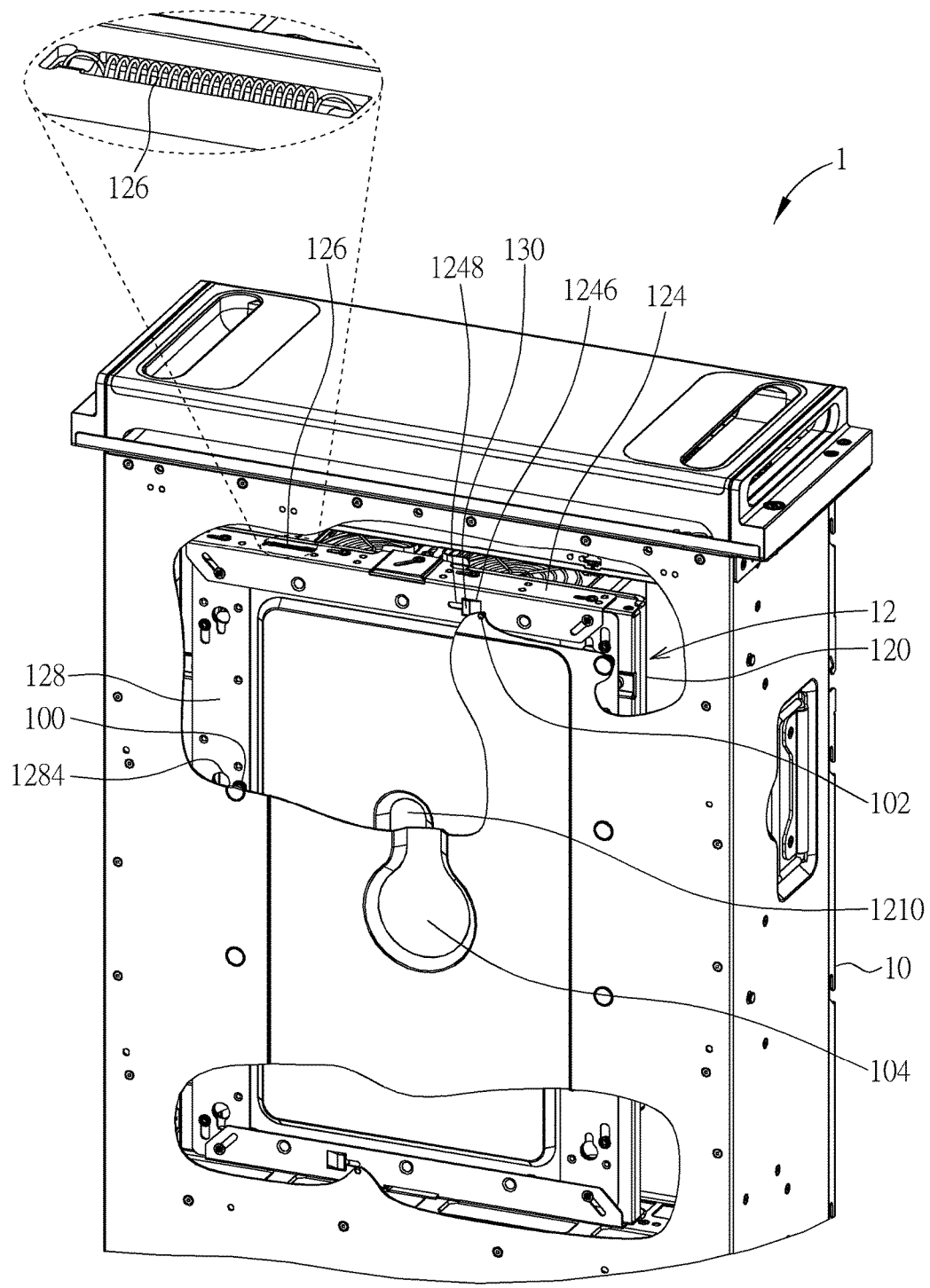
FIG. 11 is a perspective view illustrating the first positioning portion and the second positioning portion before being aligned with each other.

As shown in FIG. 11, when the tray 12 is placed into the casing 10 and the first positioning portion 104 has not been aligned with the second positioning portion 1210, the release portion 102 may not be aligned with the elastic sheet 130 either, i.e. the release portion 102 cannot push the elastic sheet 130. At this time, the elastic sheet 130 still engages with the restraining recess 1246. Accordingly, before the first positioning portion 104 aligns with the second positioning portion 1210, the handle 122, the sliding member 124 and the lock member 128 of the tray 12 may still be kept at the positions shown in FIG. 10 even if the user releases the handle 12. Therefore, the disclosure can prevent the elastic member 126 from driving the sliding member 124 to move before the first positioning portion 104 aligns with the second positioning portion 1210, so as to allow the tray 12 to be assembled with the casing 10 successfully.

In addition, as shown in FIGS. 4 and 5, the disclosure may dispose two sliding members 124 on opposite sides of the tray 12 and dispose two lock members 128 on the other opposite sides of the tray 12, wherein the two sliding members 124 are arranged with respect to each other by 180 degrees and the two lock members 128 are arranged with respect to each other by 180 degrees. Opposite sides of the sliding member 124 have two second driving grooves 1244 and opposite sides of the lock member 128 have two second driving portions 1282, wherein the two second driving grooves 1244 have opposite axial directions. Accordingly, as shown in FIG. 4, when the handle 122 moves along the first direction D1, the two sliding members 124 moves along the second direction D2 and the fourth direction D4, respectively, and the two lock members 128 moves along the third direction D3 and the fifth direction D5, respectively. It should be noted that the connection and operating principle of the handle 122, the sliding member 124 and the lock member 128 have been mentioned in the above, so those will not be depicted herein again.

Figure 12:
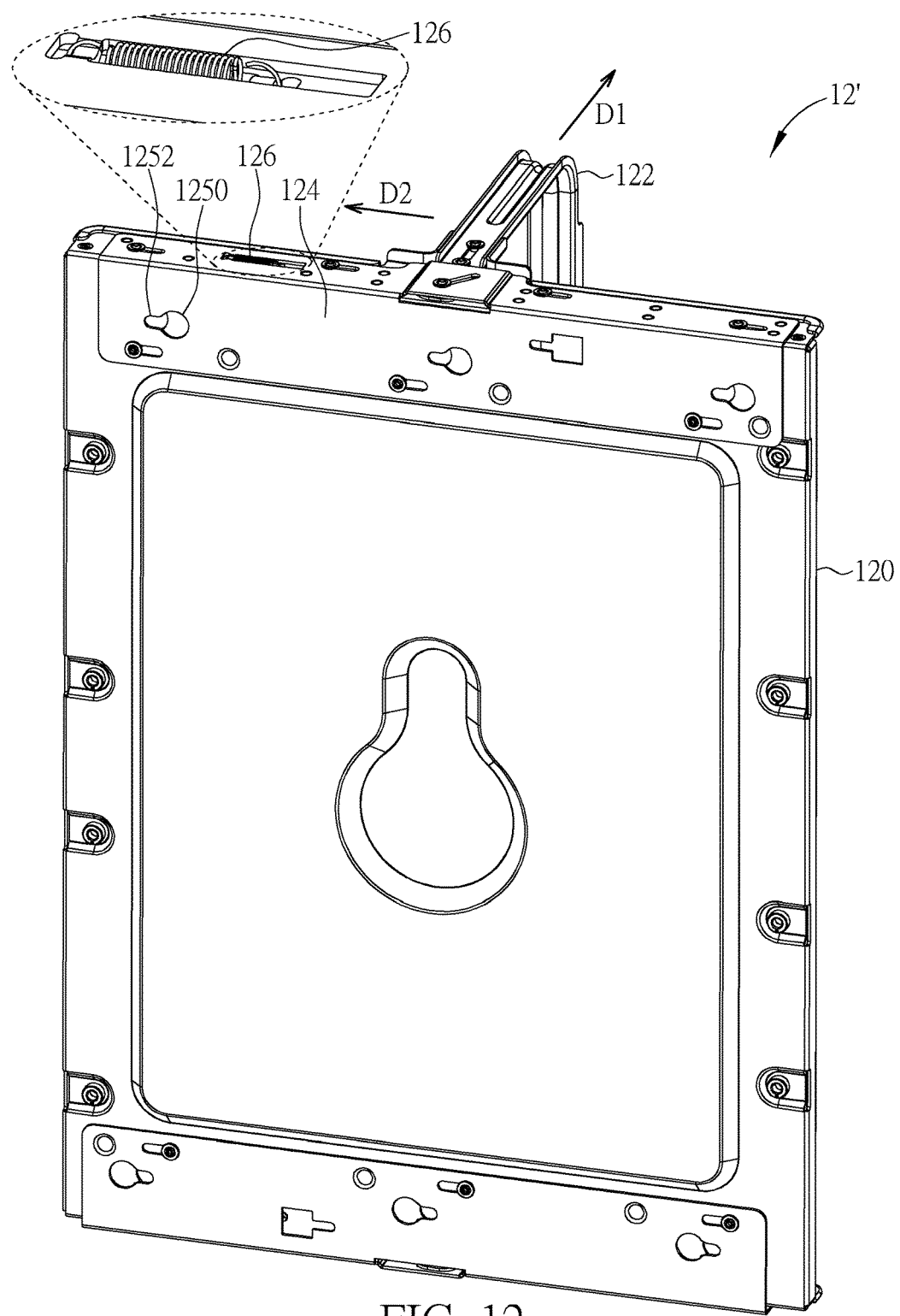
FIG. 12 is a perspective view illustrating a tray according to another embodiment of the disclosure.

As shown in FIG. 12, a tray 12' of another embodiment may not include the aforesaid lock member 128 and the sliding member 124 may include a through hole 1250 and an engaging recess 1252. When the tray 12 of the electronic device 1 is replaced by the tray 12', the number and position of the engaging portions 100 of the casing 10 correspond to the number and position of the through holes 1250 and the engaging recesses 1252 of the sliding member 124. When the tray 12 is locked on the casing 10, the engaging portion 100 of the casing 10 engages with the engaging recess 1252 of the sliding member 124. At this time, the relative positions of the handle 122 and the sliding member 124 of the tray 12 are shown in FIG. 12, wherein the elastic member 126 has not deformed yet. When the handle 122 moves along the first direction D1, the driving portion 1222 of the handle 122 presses a side wall of the driving groove 1242 of the sliding member 124, such that the sliding member 124 moves along the second direction D2 and deforms the elastic member 126. After the sliding member 124 moves along the second direction D2, the engaging portion 100 disengages from the engaging recess 1252 and is aligned with the through hole 1250. At this time, the user can lift and remove the tray 12 from the casing 10.

As mentioned in the above, the disclosure may dispose an electronic module (e.g. self-driving simulator) on the tray. When the tray is locked on the casing, a user just needs to lift the handle to release the tray from the casing, so as to lift and remove the tray and the electronic module from the casing. Furthermore, the user may lift the handle and place the tray and the electronic module into the casing. Then, the user just needs to release the handle, such that the tray may be locked on the casing automatically by means of an elastic force generated by the elastic member. Accordingly, the user can utilize the tray of the disclosure to assemble or disassemble the electronic module conveniently and rapidly.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
    a casing comprising an engaging portion; and
    a tray disposed in the casing, the tray comprising:
        a tray body comprising a side plate and a bottom plate;
        a handle movably connected to the side plate, the handle comprising a first driving portion;
        a sliding member movably connected to the side plate, the sliding member comprising a first driving groove and a second driving groove, the first driving portion being disposed in the first driving groove;
        an elastic member, opposite ends of the elastic member being respectively connected to the side plate and the sliding member; and
        a lock member movably connected to the bottom plate, the lock member comprising a second driving portion, a through hole and an engaging recess, the second driving portion being disposed in the second driving groove, the through hole being connected to the engaging recess, the engaging portion engaging with the engaging recess;
    wherein when the handle moves along a first direction, the first driving portion presses a side wall of the first driving groove, such that the sliding member moves along a second direction and deforms the elastic member; when the sliding member moves along the second direction, a side wall of the second driving groove presses the second driving portion, such that the lock member moves along a third direction; after the lock member moves along the third direction, the engaging portion disengages from the engaging recess and is aligned with the through hole; the second direction is perpendicular to the first direction, and the third direction is perpendicular to the first direction and the second direction.

2. The electronic device of claim 1, wherein the side plate comprises a first connecting portion, the handle comprises a first sliding groove, and the first connecting portion is disposed in the first sliding groove, such that the handle is movably connected to the side plate.

3. The electronic device of claim 1, wherein the sideplate comprises a second connecting portion, the sliding member comprises a second sliding groove, and the second connecting portion is disposed in the second sliding groove, such that the sliding member is movably connected to the side plate.

4. The electronic device of claim 1, wherein the bottom plate comprises a third connecting portion, the lock member comprises a third sliding groove, and the third connecting portion is disposed in the third sliding groove, such that the lock member is movably connected to the bottom plate.

5. The electronic device of claim 1, wherein the tray comprises an elastic sheet, the elastic sheet is fixed on the bottom plate, the sliding member comprises a restraining recess, and the elastic sheet engages with the restraining recess after the sliding member moves along the second direction.

6. The electronic device of claim 5, wherein the casing comprises a release portion, and the release portion pushes the elastic sheet when the tray is placed into the casing, such that the elastic sheet disengages from the restraining recess.

7. The electronic device of claim 6, wherein the sliding member comprises a pocket recess, the pocket recess is connected to the restraining recess, and the elastic member drives the sliding member to move along a fourth direction when the elastic sheet disengages from the restraining recess, such that the release portion moves from the restraining recess to the pocket recess; the fourth direction is opposite to the second direction.

8. The electronic device of claim 1, wherein the casing comprises a first positioning portion, the bottom plate comprises a second positioning portion, a shape of the first positioning portion corresponds to a shape of the second positioning portion, and the first positioning portion cooperates with the second positioning portion to position the tray in the casing when the tray is placed into the casing.

9. A tray comprising:
    a tray body comprising a side plate and a bottom plate;
    a handle movably connected to the side plate, the handle comprising a first driving portion;
    a sliding member movably connected to the side plate, the sliding member comprising a first driving groove and a second driving groove, the first driving portion being disposed in the first driving groove;
    an elastic member, opposite ends of the elastic member being respectively connected to the side plate and the sliding member; and
    a lock member movably connected to the bottom plate, the lock member comprising a second driving portion, a through hole and an engaging recess, the second driving portion being disposed in the second driving groove, the through hole being connected to the engaging recess;
    wherein when the handle moves along a first direction, the first driving portion presses a side wall of the first driving groove, such that the sliding member moves along a second direction and deforms the elastic member; when the sliding member moves along the second direction, aside wall of the second driving groove presses the second driving portion, such that the lock member moves along a third direction; the second direction is perpendicular to the first direction, and the third direction is perpendicular to the first direction and the second direction.

10. The tray of claim 9, wherein the side plate comprises a first connecting portion, the handle comprises a first sliding groove, and the first connecting portion is disposed in the first sliding groove, such that the handle is movably connected to the side plate.

11. The tray of claim 9, wherein the side plate comprises a second connecting portion, the sliding member comprises a second sliding groove, and the second connecting portion is disposed in the second sliding groove, such that the sliding member is movably connected to the side plate.

12. The tray of claim 9, wherein the bottom plate comprises a third connecting portion, the lock member comprises a third sliding groove, and the third connecting portion is disposed in the third sliding groove, such that the lock member is movably connected to the bottom plate.

13. The tray of claim 9, wherein the tray comprises an elastic sheet, the elastic sheet is fixed on the bottom plate, the sliding member comprises a restraining recess, and the elastic sheet engages with the restraining recess after the sliding member moves along the second direction.

14. The tray of claim 13, wherein the sliding member comprises a pocket recess and the pocket recess is connected to the restraining recess.

15. An electronic device comprising:
a casing comprising an engaging portion; and
a tray disposed in the casing, the tray comprising:
 a tray body comprising a side plate;
 a handle movably connected to the side plate, the handle comprising a driving portion;
 a sliding member movably connected to the side plate, the sliding member comprising a driving groove, a through hole and an engaging recess, the driving portion being disposed in the driving groove, the through hole being connected to the engaging recess, the engaging portion engaging with the engaging recess; and
 an elastic member, opposite ends of the elastic member being respectively connected to the side plate and the sliding member;
wherein when the handle moves along a first direction, the driving portion presses a side wall of the driving groove, such that the sliding member moves along a second direction and deforms the elastic member; after the sliding member moves along the second direction, the engaging portion disengages from the engaging recess and is aligned with the through hole; the second direction is perpendicular to the first direction.

* * * * *